METHOD FOR NEUTRALIZING CHARGE IN SEMICONDUCTOR BODIES AND DIELECTRIC COATINGS INDUCED BY CATHODIC ETCHING

Filed July 24, 1972

3,791,952

METHOD FOR NEUTRALIZING CHARGE IN SEMICONDUCTOR BODIES AND DIELECTRIC COATINGS INDUCED BY CATHODIC ETCHING

Edward Franklin Labuda, Allentown, and William Dennis Ryden, Whitehall, Pa., assignors to Bell Telephone Laboratories, Incorporated, Murray Hill, N.J.

Filed July 24, 1972, Ser. No. 274,487
Int. Cl. C23c *15/00*
U.S. Cl. 204—192 4 Claims

ABSTRACT OF THE DISCLOSURE

In the fabrication of semiconductor devices the masked backsputtering of metal layers to define metallization patterns results in a residual positive charge in underlying exposed dielectric films. This charge may deleteriously affect the operation of the resultant device structure. In accordance with this invention, this positive charge is controllably neutralized either by sputtering a thin metal film, for example, of nickel, over the entire surface or by otherwise depositing a thin metal film which then is exposed to a suitable source of radiation. The metal film then is removed conveniently by the same technique which removes the metal backsputtering mask.

This invention relates to the fabrication of semiconductor devices and, more particularly, to a device in which the metallization patterns are defined by cathodic etching techniques which result in the formation of electrical charge in surface dielectric films.

BACKGROUND OF THE INVENTION

A useful technique for defining metallization patterns on the surface of semiconductor devices is by a cathodic etching, also called backsputtering, technique. In particular, selective backsputtering may be used by providing a mask of a metal which is less susceptible to cathodic etching. Such a technique is disclosed in the application of G. K. Herb-E. F. Labuda, Ser. No. 209,560, filed Dec. 10, 1971, assigned to the same assignee as this application. However, it has been found that when this method is used to define metal patterns on devices in which the process terminates with the exposure of underlying dielectric films, a residual positive charge is formed in the dielectric films which seriously degrades the operation of the device being fabricated.

This residual positive charge affects the so-called flat-band voltage of field effect devices manufactured by the cathodic etching process. More particularly, charge coupled devices of the type described in the article entitled "Charge Coupled Semiconductor Devices," W. S. Boyle and G. E. Smith, The Bell System Technical Journal, vol. 49, Part I, p. 587, 1970, are affected in this manner when made using cathodic etching. The residual positive charge may inhibit charge transfer or produce continuous leakage, rendering the fabrication of useful devices impracticable. Accordingly a method is needed for neutralizing or removing this induced charge which is compatible with the remainder of the semiconductor device processing.

SUMMARY OF THE INVENTION

In accordance with this invention, the unwanted charge induced by backsputtering of metal layers is neutralized by the application of a thin film of metal in conjunction with a radiation discharge, that is, exposure to a suitable source of radiation, such as a gas discharge. The desired threshold voltage for the field effect devices being fabricated is a function not only of the metal used, but also of the conditions under which the discharge is carried out. One method in accordance with this invention comprises forming a very thin film of metal over the entire device surface and metallization pattern. In one embodiment of the invention the metal film is applied by cathodic sputtering which produces the desired neutralization of the positive charge. Alternatively, the metal film may be applied by other means, such as by vapor deposition, and then exposed to a suitable radiation discharge. In particular, after the metal film is applied by evaporation plating, it is placed in a plasma discharge to neutralize the positive charge. Other kinds of discharge, for example, suitable portions of the ultra-violet radiation spectrum, may provide the desired neutralization.

The extent to which the positive charge is neutralized directly affects the threshold or "turn-on" voltage of the field effect devices being made. Further, the extent of charge neutralization appears to be a consequence of the work function of the metal used with respect to the adjoining dielectric. The degree of neutralization also will be affected by the application of a bias across the metal-dielectric structure during exposure to discharge.

It is important that the metal used for the electron source be removable by a method which does not deleteriously affect the device structure. In one advantageous embodiment in which nickel is used as the backsputtering mask, the photoinjected electron source may be a thin film of nickel of the order of several hundred angstroms thick. In this embodiment all of the nickel layers are removed conveniently by chemical etching upon the completion of the process. In addition to nickel, other metals, including palladium and light metals, such as arsenic, may be used.

There appear to be several possible understandings regarding how the undesired positive charge is being neutralized by these techniques. It is possible that the metal film is providing a source of electrons for photoinjection into the dielectric layer. Or, the effect may be a consequence of a change in the field configuration within the dielectric layer caused by the presence of the metal film.

DESCRIPTION OF THE DRAWING

The invention and its various objects and features will be more clearly understood from the following detailed description taken in conjunction with the drawing in which.

DETAILED DESCRIPTION

Figure 1:
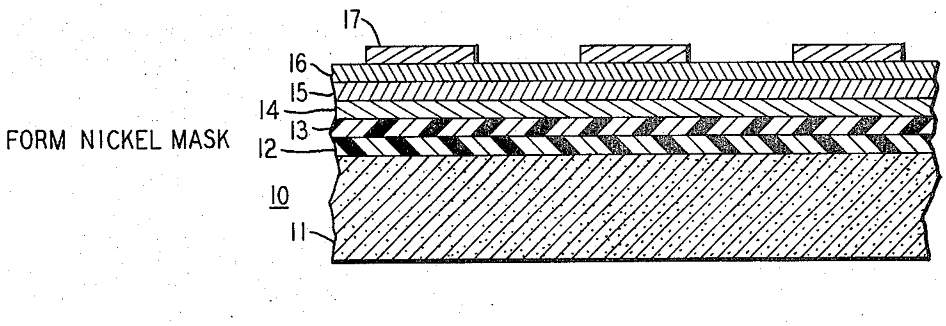
FIGS. 1 through 4 illustrate, using a section view of a portion of a semiconductor body, a series of processing steps in accordance with the invention.

Referring to FIG. 1, there is shown a portion of a semiconductor slice 10 having a series of layers of different metals and a selectively formed nickel layer. This arrangement is as shown in the above-referred to application of Herb and Labuda. In particular, the silicon semiconductor body 11 has a dielectric layer comprising a film of silicon dioxide 12 and an overlying film 13 of aluminum oxide. On top of this dielectric layer 12–13 is a first metal layer 14 of titanium, a second metal layer 15 of palladium and a relatively heavier third layer 16 of gold. Alternatively, platinum may be used instead of palladium. In a typical structure for making a charge coupled device, the silicon dioxide film may be about 1000 angstroms thick and the aluminum oxide film about 500 angstroms thick. Advantageously the silicon dioxide may be thermally grown and the aluminum oxide is deposited. Other dielectric compounds may be used and in various combinations of layers all of which are encompassed by the term "dielectric layer" in this disclosure.

The titanium layer 14 typically is about 1000 angstroms thick and the palladium layer 15 about 2000 angstroms thick, both being thermally evaporated. The overlying gold layer 16 is about 10,000 angstroms thick and is formed by electroplating. The nickel backsputtering mask 17 conveniently is formed by electroplating on the gold layer 16 using a photoresist pattern to define the nickel plating. The photoresist then is removed by a suitable solvent.

Figure 2:
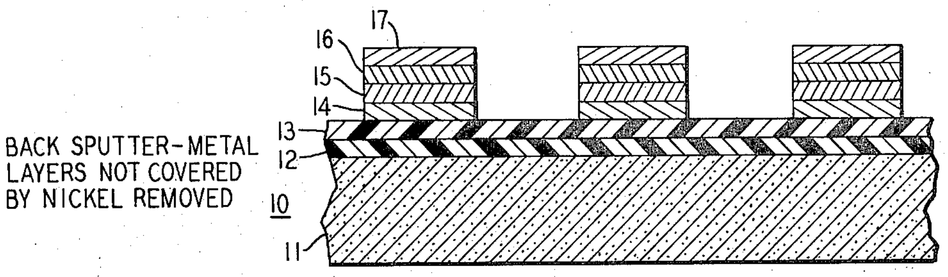

Then, referring to FIG. 2, the structure is backsputtered to remove the metal portions not covered by the nickel mask 17. Thus, there is exposed the dielectric layer 12 and 13 intervening the metal layers which later comprise the gate electrodes of field effect structures. However, in the portions of the dielectric layer intervening the metal gates, the backsputtering process produces a positive charge which may be sufficient to alter the flatband voltage by as much as 40 volts. In devices in which the threshold voltages are desired of about one or two volts, such a shift effectively prevents the realization of useful device structures.

Figure 3:
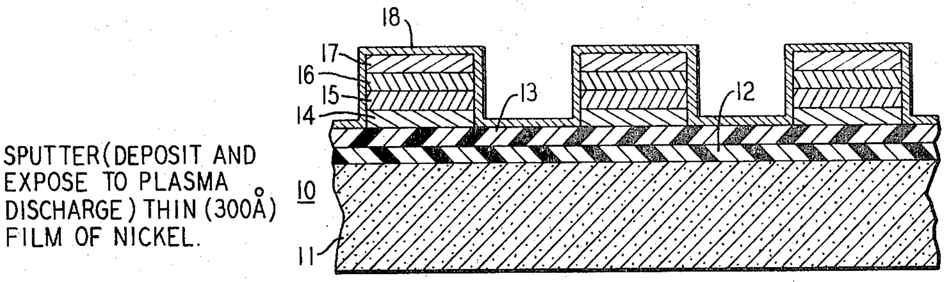

Referring to FIG. 3, the curative process comprises forming another metal layer 18, in this specific embodiment, of nickel, over the entire surface. The nickel film 18 may be formed conveniently by sputtering or may be evaporated or deposited by any technique which is not otherwise destructive of the device structure. If the metal film 18 is formed by sputtering, the process inherently produces the necessary effect and neutralizes the positive charge induced by backsputtering. If the metal layer 18 has been evaporated, the semiconductor slice must be exposed to a plasma or other discharge such as ultraviolet radiation which produces the desired neutralizing effect.

Figure 4:
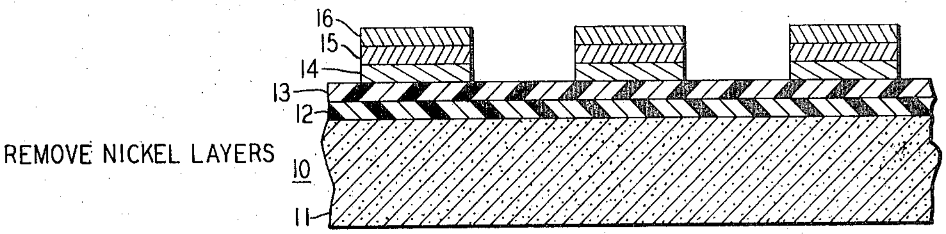

Then, as shown in FIG. 4, an etchant such as disclosed in the above-referred to Herb and Labuda application, is used to remove the nickel film 18 as well as the nickel mask 17. The resultant structure comprises the metallization pattern composed of the three meal layers 14, 15 and 16 on a dielectric layer 12–13 from which the undesired positive charge has been removed.

What is claimed is:

1. A method of fabricating semiconductor devices in which selective cathodic etching is used to define a metallization pattern on a surface of a semiconductor body having a dielectric layer thereon which method includes forming at least one metal layer on the dielectric coated surface of the semiconductor body, forming a cathodic etching mask on the one metal layer, subjecting the surface to cathodic etching to remove the portions of the one metal layer not covered by the mask, characterized in that a thin metal film then is deposited over the entire surface, exposed to a radiation discharge, and then is removed.

2. The method in accordance with claim 1 in which said thin metal film is deposited by cathodic sputtering which thereby provides the radiation discharge.

3. The method in accordance with claim 1 in which said thin metal film is deposited and then exposed to a radiation discharge.

4. The method in accordance with claim 1 in which said thin metal film is one selected from the group consisting of nickel and palladium.

References Cited

UNITED STATES PATENTS

| | | | |
|---|---|---|---|
| 3,271,286 | 9/1966 | Lepselter | 204—192 |
| 3,663,279 | 5/1972 | Lepselter | 117—212 |

JOHN H. MACK, Primary Examiner

T. TUFARIELLO, Assistant Examiner